(12) United States Patent
Tu et al.

(10) Patent No.: US 8,896,096 B2
(45) Date of Patent: Nov. 25, 2014

(54) PROCESS-COMPATIBLE DECOUPLING CAPACITOR AND METHOD FOR MAKING THE SAME

(75) Inventors: Kuo-Chi Tu, Hsin-Chu (TW); Wen-Ting Chu, Kaohsiung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 112 days.

(21) Appl. No.: 13/553,086

(22) Filed: Jul. 19, 2012

(65) Prior Publication Data

US 2014/0021584 A1 Jan. 23, 2014

(51) Int. Cl.
*H01L 21/02* (2006.01)

(52) U.S. Cl.
USPC .......................................... 257/532; 365/148

(58) Field of Classification Search
CPC ..... H01L 23/5223; H01L 28/40; H01L 23/52; H01L 23/522; H01L 23/5222; H01L 27/224; H01L 29/405; H01L 29/49; H01L 29/4983; H01L 29/94; H01L 27/24; H01L 27/10852; H01L 21/768; G11C 13/0004; G11C 13/0069
USPC .......................................... 257/532; 365/148
See application file for complete search history.

(56) References Cited

U.S. PATENT DOCUMENTS

| | | | |
|---|---|---|---|
| 6,677,637 B2 | 1/2004 | Ning et al. | |
| 6,737,728 B1 | 5/2004 | Block et al. | |
| 6,781,185 B2 | 8/2004 | Chen et al. | |
| 6,803,641 B2 | 10/2004 | Papa Rao et al. | |
| 6,849,891 B1 | 2/2005 | Hsu et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 7,195,970 B2 | 3/2007 | Tu et al. | |
| 7,307,268 B2 * | 12/2007 | Scheuerlein | 257/2 |
| 7,407,858 B2 | 8/2008 | Li et al. | |
| 7,557,399 B2 | 7/2009 | Tu et al. | |
| 8,000,128 B2 | 8/2011 | Li et al. | |
| 8,009,454 B2 | 8/2011 | Lee et al. | |
| 8,617,949 B2 | 12/2013 | Tu et al. | |
| 2005/0082639 A1 * | 4/2005 | Kikuta et al. | 257/533 |
| 2005/0242438 A1 * | 11/2005 | Cathelin et al. | 257/758 |
| 2006/0103031 A1 * | 5/2006 | Wu | 257/781 |
| 2007/0138531 A1 * | 6/2007 | Tu et al. | 257/303 |
| 2010/0237317 A1 * | 9/2010 | Tsunoda | 257/4 |
| 2012/0091519 A1 * | 4/2012 | Tu | 257/303 |
| 2012/0091559 A1 | 4/2012 | Tu et al. | |

* cited by examiner

*Primary Examiner* — Long K Tran
(74) *Attorney, Agent, or Firm* — Haynes and Boone, LLP

(57) ABSTRACT

Provided is decoupling capacitor device. The decoupling capacitor device includes a first dielectric layer portion that is deposited in a deposition process that also deposits a second dielectric layer portion for a non-volatile memory cell. Both portions are patterned using a single mask. A system-on-chip (SOC) device is also provided, the SOC include an RRAM cell and a decoupling capacitor situated in a single inter-metal dielectric layer. Also a method for forming a process-compatible decoupling capacitor is provided. The method includes patterning a top electrode layer, an insulating layer, and a bottom electrode layer to form a non-volatile memory element and a decoupling capacitor.

18 Claims, 8 Drawing Sheets

PROCESS-COMPATIBLE DECOUPLING CAPACITOR AND METHOD FOR MAKING THE SAME

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, and some of these involve capacitors. Additionally, capacitors may be used in other applications on an integrated circuit (IC), including for signal conditioning. During the operation of certain circuits, power supply lines may supply transient currents with a relatively high intensity. These conditions can result in noise on the power supply lines. Specifically, the voltage on the power supply line may fluctuate when the transition time of the transient current is particularly short or when the line's parasitic inductance or parasitic resistance is large. To ameliorate such conditions, filtering or decoupling capacitors may be used, acting as temporary charge reservoirs to prevent momentary fluctuations in supply voltage.

Integrating decoupling capacitors into certain systems-on-chip (SOCs), particularly those involving certain types of memory, may entail a number of problems. For example, some decoupling capacitors may suffer from capacitance variations caused by the doping characteristics of the polysilicon capacitor electrode plates. These devices can exhibit fairly large changes in capacitance as a function of applied voltage, thus having a large voltage coefficient of capacitance, and may have problematic parasitic effects. Decoupling capacitors on certain SOCs have not been entirely satisfactory to date and may pose increasing problems in the future.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
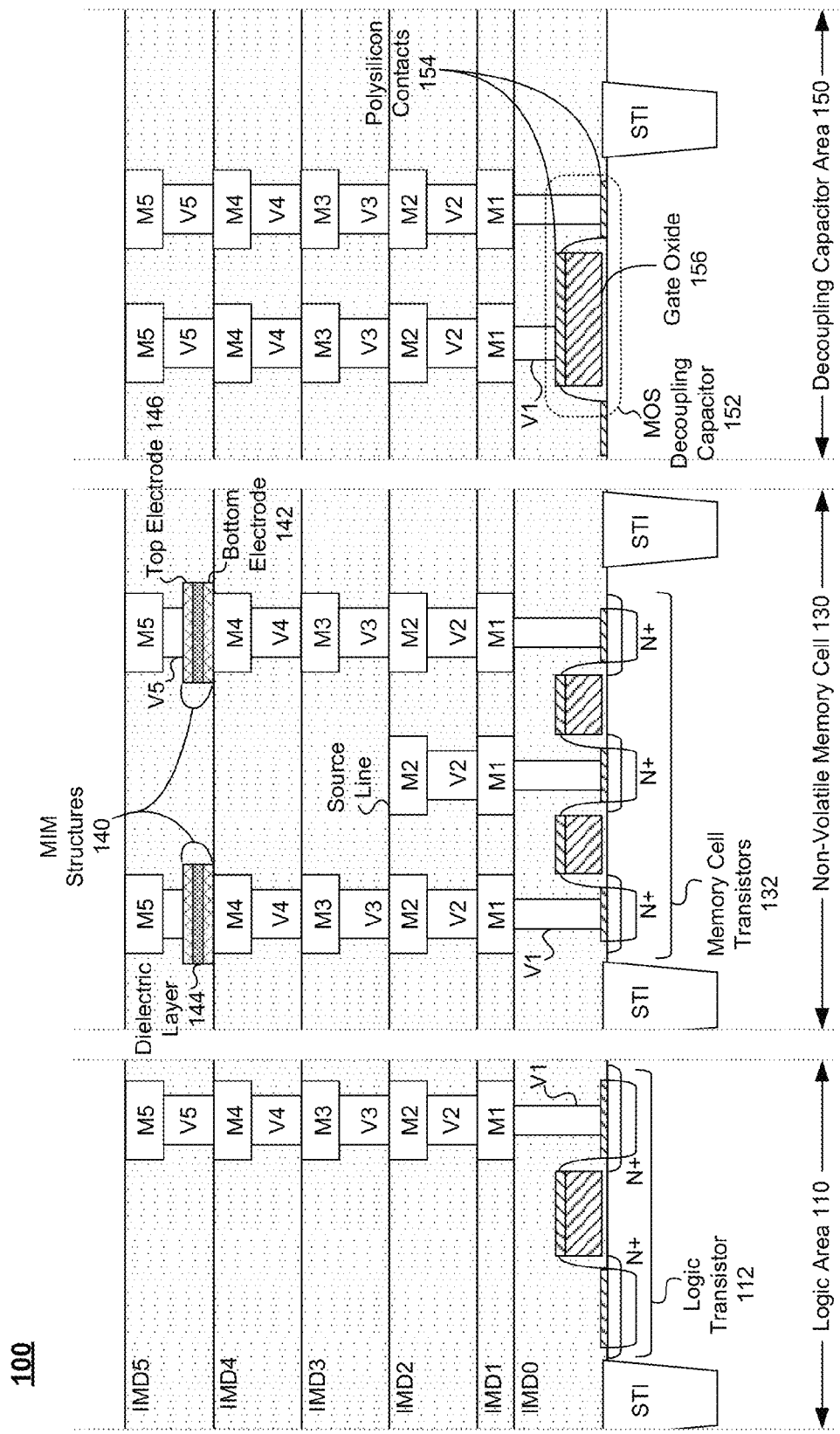
FIG. 1 depicts a cross-section of a system-on-chip (SOC) that includes a MOS decoupling capacitor.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 illustrates a system-on-chip (SOC) 100, which may include a plurality of functional areas fabricated on a single substrate. As depicted in FIG. 1, SOC 100 includes a logic area 110, a non-volatile memory (NVM) cell 130, and a decoupling capacitor area 150. Logic area 110 may include circuitry, such as the exemplary transistor 112, for processing information received from non-volatile memory cell 130 and for controlling reading and writing functions of NVM cell 130. In some embodiments, NVM cell 130 is a resistive random-access memory (RRAM) cell; RRAM is one of several different types of non-volatile computer memory. While NVM cell 130 may frequently be referred to herein as RRAM cell 130, SOC 100 is not limited to RRAM cells. An RRAM cell may be used to hold a binary piece of data, or a bit, by altering the properties of an intermediate dielectric layer in memory elements in such a way so as to alter the resistance of the layer. A bit may be encoded by setting the resistance of the dielectric layer to a relatively high resistance state or a relatively low resistance state, with a value of one assigned to one state and a value of zero assigned to the other state. RRAM cell 130 may include a pair of metal-insulator-metal (MIM) structures 140 that serve as memory elements of RRAM cell 130. Each MIM structure 140 may include a bottom electrode 142 and top electrode 146, with a dielectric layer 144 sandwiched in between the two electrodes.

Both MIM structures 140 may be fabricated in conjunction using semiconductor fabrication techniques known to those of skill in the art. Other types of non-volatile computer memory that may be substituted for the RRAM cell in some embodiments of SOC 100 that include flash memory, ferroelectric RAM, magnetic RAM, phase-change RAM.

Decoupling capacitor area 150, as depicted, includes a metal-oxide-semiconductor (MOS) decoupling capacitor 152. MOS decoupling capacitor 152 may include electrodes made from polysilicon, rather than metal, the electrodes are depicted as polysilicon contacts 154. Polysilicon contacts 154 may be formed in a single process that is also used to form gate, source, and drain contacts for transistors across SOC 100, including logic transistor 112 depicted in logic area 110 and memory cell transistors 132 in RRAM cell 130. Additionally, an oxide layer 156 of MOS decoupling capacitor 152 may be a gate oxide such as may be formed in a single process that also forms gate oxide layers in transistor 112 and RRAM transistors 132. FIG. 1 also depicts dopant profiles associated with these transistors.

Other features depicted in FIG. 1 include shallow-trench isolation (STI) features, and pluralities of metallization layers and vias. As depicted, SOC 100 is fabricated using five metallization layers, labeled as M1 through M5, with five layers of metallization vias or interconnects, labeled as V1 through V5. Other embodiments may contain more or fewer metallization layers and a corresponding more or fewer number of vias. Logic area 110 includes a full metallization stack, including a portion of each of metallization layers M1-M5 connected by interconnects V2-V5, with V1 connecting the stack to a source/drain contact of logic transistor 112. RRAM cell 130 includes a full metallization stack connecting MIM structures 140 to RRAM transistors 132, and a partial metallization stack connecting a source line to RRAM transistors 132. MIM structures 140 are depicted as being fabricated in between the top of the M4 layer and the bottom the M5 layer. MOS decoupling capacitor 152 is connected to full metallization stacks both on its gate electrode and its source/drain electrode.

Also included in SOC 100 is a plurality of inter-metal dielectric (IMD) layers. Six IMD layers, identified as IMD0 through IMD5 are depicted in FIG. 1 as spanning the logic area 110, RRAM cell 130, and decoupling capacitor area 150. The IMD layers may provide electrical insulation as well as structural support for the various features of SOC 100 during many fabrication process steps, some of which will be discussed herein.

MOS decoupling capacitor 152 may be used by SOC 100 to condition power supply lines that supply current to charge and discharge active and passive devices included in SOC 100. When voltages swing during a clock transition, fluctuations on the power supply lines may introduce noise. MOS decoupling capacitor 152 acts as a charge reservoir to smooth out a certain amount of the introduced noise. However, MOS decoupling capacitor 152 can exhibit certain problems. Since MOS decoupling capacitor 152 features contact electrodes made from polysilicon, the capacitance can vary according to variations in the polysilicon doping characteristics. MOS decoupling capacitor 152 may also suffer from parasitic effects given its proximity to the substrate. These and other issues can degrade the noise-filtering performance of MOS decoupling capacitor 152.

Figure 2:
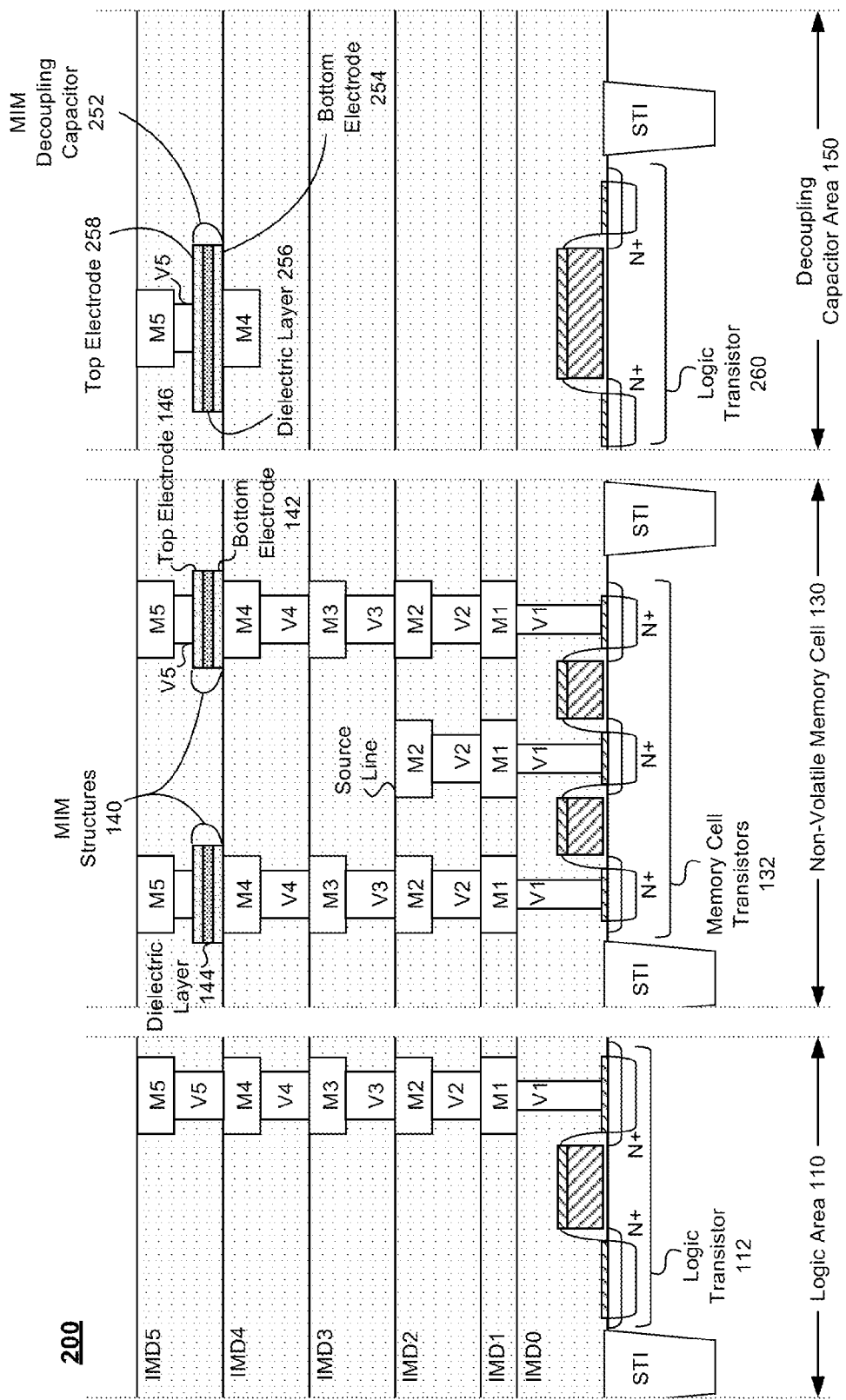
FIG. 2 depicts a cross-section of an SOC that includes a metal-insulator-metal (MIM) capacitor.

FIG. 2 illustrates another SOC, SOC 200, which shares some of the features of SOC 100. Specifically, SOC 200 may include a logic area 110 and an NVM cell area 130 substantially as included in SOC 100 and described above. However, SOC 200 may include a MIM decoupling capacitor 252 in a decoupling capacitor area 150. MIM decoupling capacitor 252 may be fabricated following substantially the same process steps as MIM structures 140 of RRAM cell 130. Therefore, MIM decoupling capacitor 252 may include a bottom electrode 254 and a top electrode 258 with an insulating dielectric layer 256 sandwiched in between. MIM decoupling capacitor 252 may be connected to other elements of SOC 200, including elements that are not depicted in the drawings, by contact with metallization layers. As depicted in FIG. 2, MIM decoupling capacitor 252 is coupled to other features of SOC 200 by contact with the M4 and M5 layers and thus is embedded or situated within IMD5.

Unlike MOS decoupling capacitor 152 of FIG. 1, MIM decoupling capacitor 252 may be fabricated simultaneously with MIM structures 140. For example, after M4 has been patterned and IMD4 has been deposited, SOC 200 undergoes a planarization process, such as chemo-mechanical planarization (CMP). After the CMP process, a bottom electrode 254 is deposited overlaying IMD4 and the exposed portions of M4. The bottom electrode 254 may be any of a variety of materials; specifically, bottom electrode materials may include Pt, AlCu, TiN, Au, Ti, Ta, TaN, W, WN, and Cu. Generally, the bottom electrode materials are conductive materials such as metals, certain metal nitrides, and silicided metal nitrides. The dielectric layer 256 is formed from an insulating material, including but not limited to NiO, TiO, HfO, ZrO, ZnO, $WO_3$, $Al_2O_3$, TaO, MoO, and CuO. The insulating material may be a high dielectric constant (high-k) material, which may include $TiO_2$, $Ta_2O_5$, $Y_2O_3$, $La_2O_5$, $HfO_2$, and other materials. The top electrode 258 may be fabricated of any of the same materials as bottom electrode 254, as described above, though the same material is not necessarily used for both the top and bottom electrodes. Though a more detailed discussion regarding fabrication methods is included below, it is important to note that after the material layers that form bottom electrode 254, dielectric layer 256, and top electrode 258 have been deposited, they may be formed by an etch process using a single mask. Thus, a single mask may be used to form MIM structures 140 and MIM decoupling capacitor 252.

This may present certain advantages in terms of material costs and time costs during the fabrication of SOC 200. Additionally, having MIM decoupling capacitor 252 raised a distance off the substrate of SOC 200 may allow for the repurposing of the surface area previously occupied by MOS decoupling capacitor 152 of FIG. 1. As depicted in FIG. 2, the substrate surface area of MIM decoupling capacitor area 250 may include additional SOC logic, including exemplary logic transistor 260.

Figure 3:
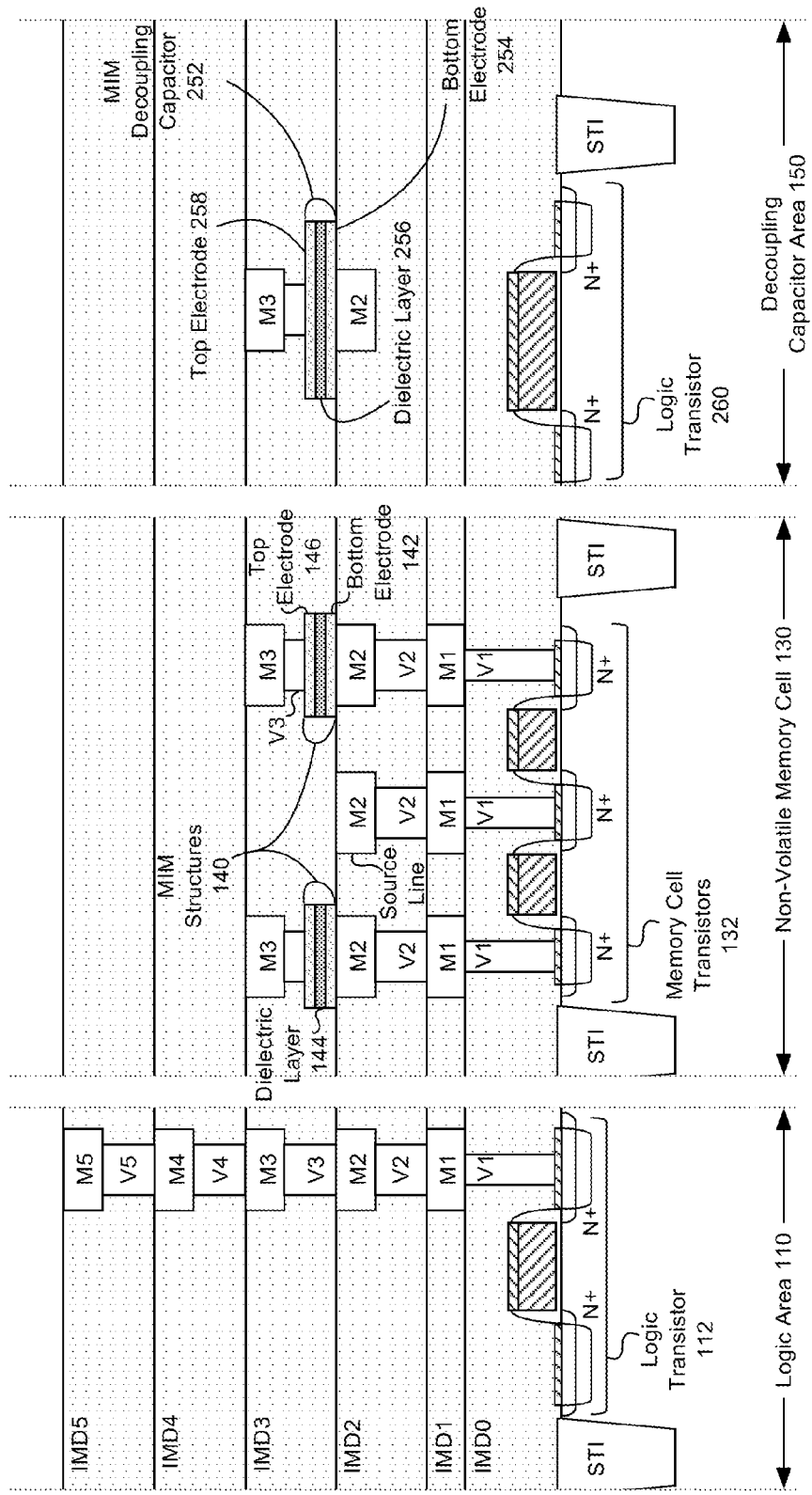
FIG. 3 depicts a cross-section of an SOC that includes a MIM capacitor fabricated in a lower level in the plurality of inter-metal dielectric layers.

FIG. 3 illustrates an embodiment referred to as SOC 300, which shares many features with SOC 200. Such shared features include logic area 110, NVM cell 130, and decoupling capacitor area 150. However, as depicted in FIG. 3, SOC 300 includes MIM structures 140 and MIM decoupling capacitor 252 between M2 and M3 layers, rather than between M4 and M5 layers as seen in FIG. 2. As depicted, these MIM features are fabricated in IMD3, rather than IMD5 as in FIG. 2. Generally, MIM structures 140 of RRAM cell 130 and MIM decoupling capacitor 252 may be fabricated in any of IMD1-5. Therefore, in some embodiments, MIM structures 140 and MIM decoupling capacitor 252 are fabricated in IMD4, while in other embodiments they are fabricated in IMD2. In each of these embodiments, the MIM features are patterned using a single mask.

Figure 4:
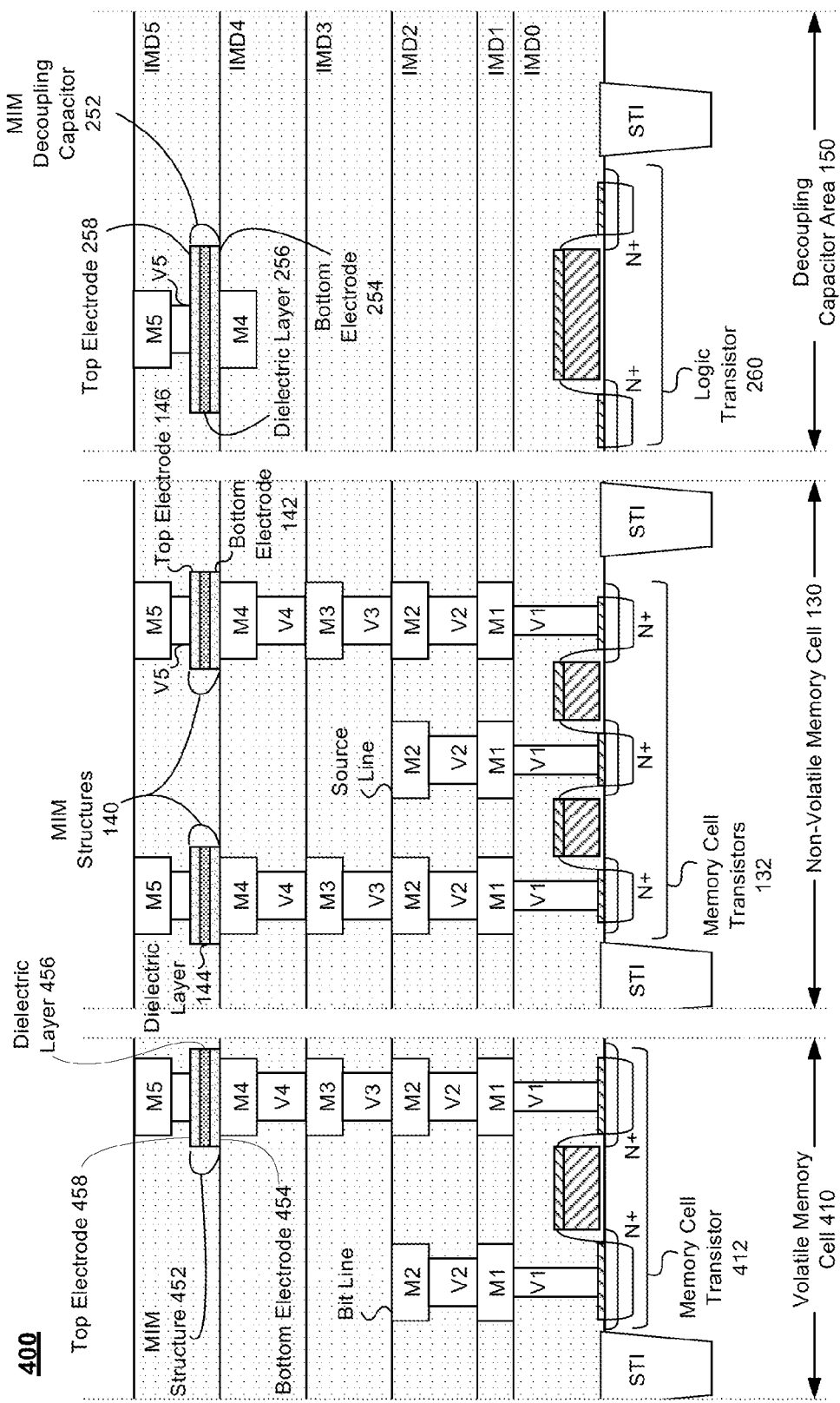
FIG. 4 depicts a cross-section of an SOC that includes a volatile memory cell, a non-volatile memory cell, and a MIM decoupling capacitor.

FIG. 4 depicts an SOC 400, which includes a volatile memory cell 410. As illustrated in FIG. 4, volatile memory cell 410 is a DRAM cell 410, though SOC 400 is not limited to DRAM cells. DRAM cell 410 may include a memory cell transistor 412, or DRAM transistor 412, which may allow a bit line to communicate with a volatile memory element 452. Volatile memory element 452 may be a capacitor formed by a bottom electrode 454 and a top electrode 458, with an insulating layer 456 sandwiched in between. This arrangement creates a capacitor which can be used to hold a charge indicating a value of one or zero. As depicted in SOC 400, volatile memory element 452 is a MIM structure 452 fabricated in between the top of M4 and the bottom of M5, thus embedded in IMD5. Volatile memory element 452 may be fabricated from the same materials and the same processes as used in the fabrication of MIM structures 140 and MIM decoupling capacitor 252. Additionally, volatile memory element 452, MIM structures 140, and MIM decoupling capacitor 252 may be formed using a single mask and at the same level above the substrate, whether measured in terms of metallization layer or IMD layer. Thus, SOC 400 may include both volatile and non-volatile memory on a single chip as well as the logic circuitry needed for operation using the process steps required only by the non-volatile memory.

Figure 5:
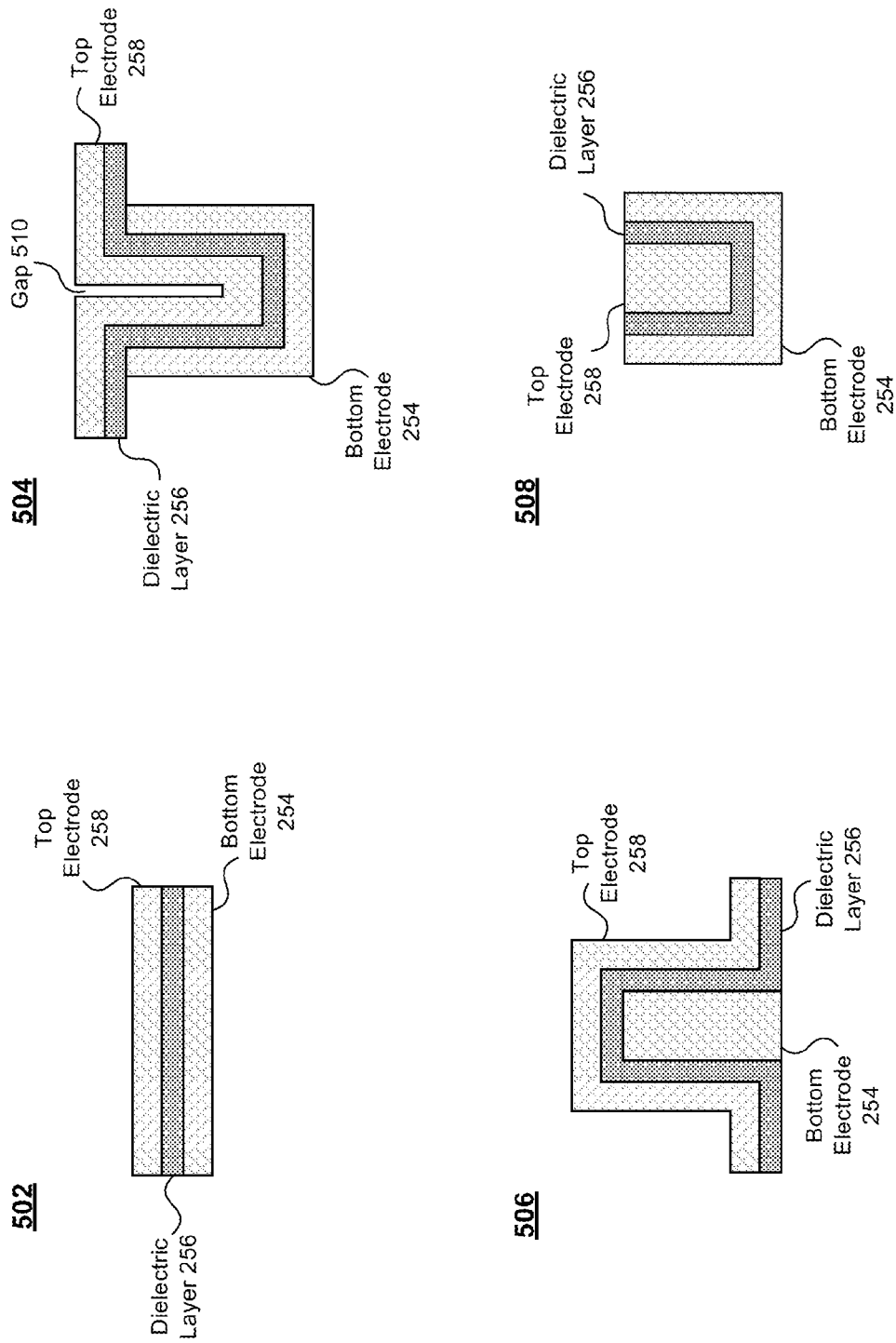
FIG. 5 depicts a plurality of MIM decoupling capacitor types that may be used in some SOC embodiments.

FIG. 5 depicts a plurality of exemplary types of MIM capacitive structures, including a planar-type MIM structure 502, a cylinder- or cup-type MIM structure 504, a bar-type MIM structure 506, and a dual-damascene MIM structure 502, which is a MIM structure formed by a dual-damascene process. The depictions of SOCs 200, 300, and 400, in FIGS. 2, 3, and 4, respectively, include planar-type MIM structures for clarity of illustration. However, in practice, any of the MIM structures in SOCs 200, 300, or 400 may include any combination of these types of capacitor structures, which each include a top and a bottom electrode on either side of a dielectric layer. For convenience, discussion of FIG. 5 will relate to the layers of MIM decoupling capacitor 252, but may also apply equally to MIM structures 140 and volatile memory element 452. For example, a planar-type MIM structure 502 used for MIM decoupling capacitor 252 includes a bottom electrode 254, a dielectric layer 256, and a top electrode 258 sandwiched together.

However, MIM decoupling capacitor 252 is, in some embodiments, a cylinder-shaped structure such as cylinder-type MIM structure 504. While cylinder-type MIM structure 504 has a rectangular cross-section when viewed from the side as in FIG. 5, when viewed from above, it has a circular cross-section. As depicted in FIG. 5, cylinder-type MIM structure 504 may include a gap 510 in the top electrode 258. In some embodiments, gap 510 is present as depicted, while in others gap 510 is absent. MIM decoupling capacitor 252 may alternatively be a bar-type capacitor, like bar-type MIM structure 506. MIM decoupling capacitor 252 may also be a dual-damascene MIM structure 508. In all cases, as in elsewhere in the figures, the relative dimensions between the capacitor structures 502-508 and within a single structure are for illustrative purposes only. In practice, the MIM structures may have significantly different dimensions than depicted. Each of the types of capacitor structures may have benefits compared to the others, such as simplicity of fabrication and decreased footprint measured with respect to the surface of the substrate.

Figure 6:
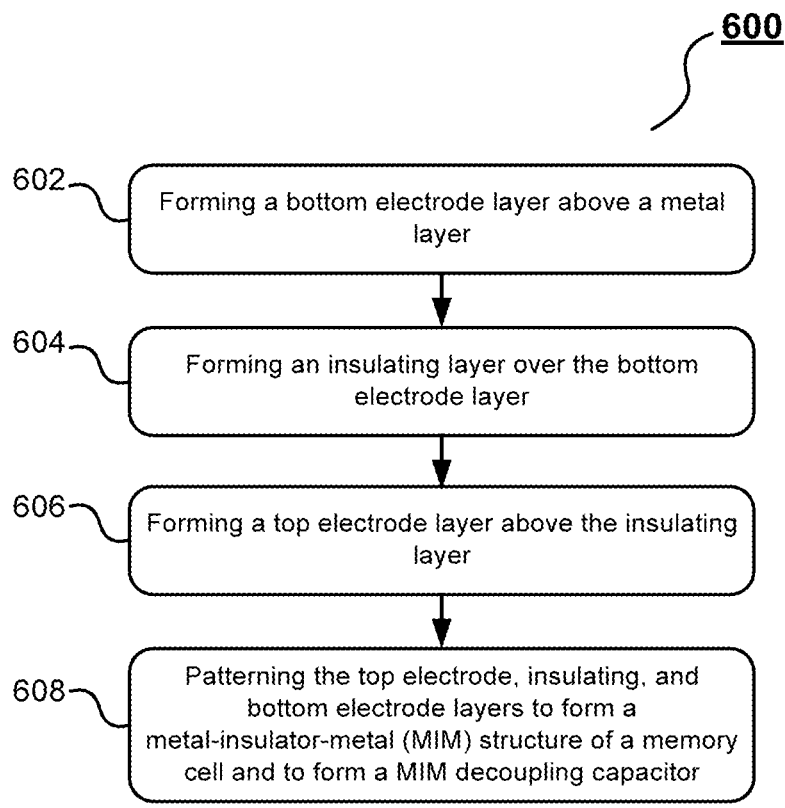
FIG. 6 is a flowchart of a method for fabricating a MIM decoupling capacitor in a process compatible with an RRAM fabrication process.

FIG. 6 is a flowchart of a method 600 for fabricating a MIM decoupling capacitor in a process that is compatible with the MIM structures of certain types of non-volatile memory, such as RRAM. Method 600 may begin in step 602 when a bottom electrode layer is formed above a metal layer. By this, it should be understood that the bottom electrode layer may be formed above a composite layer comprising a metal layer and an IMD layer, with the metal layer and the IMD both exposed in certain areas at the surface of the composite layer. Thus, the bottom electrode layer may be formed so that a portion of the bottom electrode layer is in direct physical contact with a metal layer and another portion is deposited in direct physical contact with the IMD layer. In some embodiments, the bottom electrode layer includes a plurality of conductive layers which can include different material layers, rather than a single layer of a single material. In step 604, an insulating layer may be formed in direct physical contact with the bottom electrode layer. The insulating layer may also be formed from a plurality of individual insulating layers. Each of the individual layers may be formed from a single material or each layer may be formed of a different dielectric material than the layers it directly contacts. In step 606, a top electrode layer may be formed above the insulating layer. The top electrode layer may be in direct physical contact with the insulating layer and may also comprise a plurality of different material layers.

Method 600 may conclude in step 608 when the top electrode, insulating, and bottom electrode layers are patterned to form both a MIM structure of a non-volatile memory cell and a MIM decoupling capacitor. In some embodiments, this is done using a single mask that determines of both the MIM structure and the MIM decoupling capacitor. This may be done by a number of combinations of material removal processes or it may be accomplished by a single material removal process.

Different process techniques can be used to fabricate the above-listed capacitors. Referring also to FIG. 2, in one embodiment, the MIM structure in the non-volatile memory cell can be etched simultaneously with the MIM decoupling capacitor, and in another embodiment, one MIM structure can be masked off while the other is etched or otherwise processed.

Figure 7A:
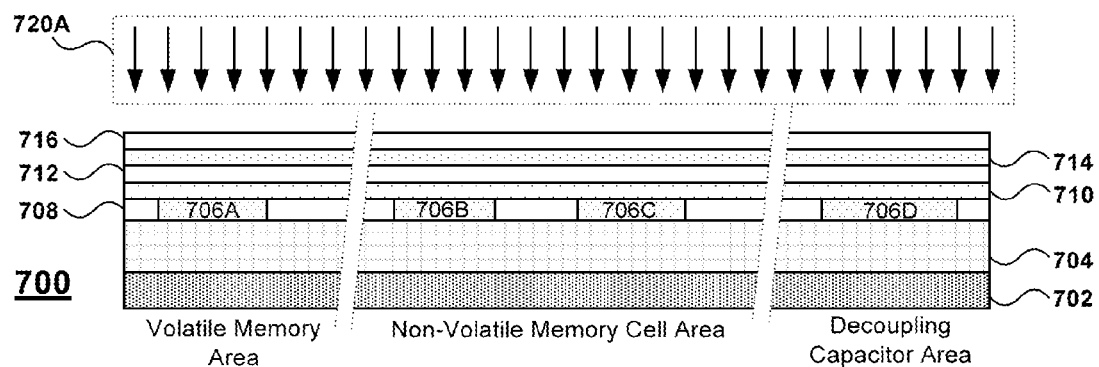
FIGS. 7A-F are cross-sectional representations of a MIM decoupling capacitor during various steps of fabrication.

FIGS. 7A-F are cross-sectional representations of an SOC 700, which may be similar in many respects to SOC 400, fabricated according to the method 600. FIG. 7A depicts a volatile memory cell area, a non-volatile memory cell area, and a decoupling capacitor area. Each of these three areas includes a portion of a substrate 702 and of intermediate layer 704. Intermediate layer 704 includes a plurality of semiconductor device layers that, for convenience and clarity, are not individually depicted. The plurality of layers depicted as the single intermediate layer 704 may include polysilicon gate and contact layers, gate and other oxide layers, interconnects between metallization layers, metallization layers, IMD layers, and others. Thus, for example, intermediate layer 704 includes IMD0 and IMD1 and all layers embedded therein as depicted by FIG. 3 or 4. Alternatively, intermediate layer 704 includes the IMD0 layer through the IMD3 layer and all layers embedded therein as depicted by FIG. 3 or 4. The SOC 700 cross-section in FIG. 7A also includes a plurality of metallization layer contact areas embedded in an IMD layer 708. As depicted, the plurality includes metallization layer contact areas 706A, 706B, 706C, and 706D which may have been patterned prior to the deposition of a bottom conductive layer 710. As mentioned, the bottom conductive layer may be formed of many different materials, and may include a plurality of layers of a single material or of different materials. In general, bottom conductive layer 710 can be made of metals and conductive metal nitrides, though any suitable conductor may be used. Bottom conductive layer 710 may be fabricated using a variety of deposition processes, including vapor deposition processes, filament evaporation, e-beam evaporation, and sputtering. Any suitable deposition process may be used in step 602 of method 600 to form the bottom conductive electrode layer 710.

SOC 700 also includes an insulating layer or dielectric layer 712. In step 604, the insulating dielectric layer 712 may be formed over the bottom conductive electrode layer 710. In general, the insulating layer may be formed of an insulating material, including the specific materials already noted. These materials may include high-k dielectrics. Suitable processes include chemical vapor depositions (CVD), such as low-pressure CVD (LPCVD), plasma-enhanced CVD (PECVD), and atomic layer deposition. In general, any suitable process for depositing the dielectric layer may be used in step 604.

SOC 700 includes a top conductive layer 714 overlaying the dielectric layer 712. While the top conductive layer 714 may include a different material or materials from bottom conductive layer 710, the kinds of materials from which, and processes by which, top conductive layer 714 may be made are substantially the same as those of bottom conductive layer 710. Any of those processes or materials may be used to form the top conductive layer 714 as part of step 606 in method 300. A CMP process may be used after the formation of top conductive layer 714, dielectric layer 712, and/or bottom conductive layer 710 to prepare the surface of the processed layer for additional fabrication steps. Overlaying the top conductive layer 714 is a masking layer 716, which may be a photoresist (PR) layer or other suitable masking layer, such as silicon nitride or silicon oxide. In embodiments, where a masking layer other than a PR layer is used, a PR layer may be used over that masking layer to pattern it in preparation for use as a masking layer.

FIG. 7A includes a depiction of a material-removal or etching process 720A. Material removal process may be a wet chemical etching with a variety of chemical etchants such as may also be a physical or dry etching process such as plasma etching, sputter etching, reactive ion etching or vapor phase etching.

Figure 7B:
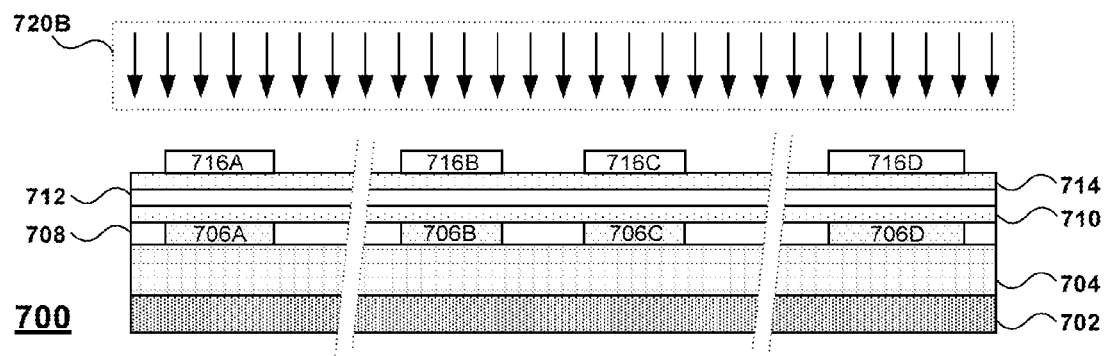

After etching process 720A, SOC 700 may appear as depicted in FIG. 7B. In FIG. 7B, the masking layer 716 has been patterned so as the form an etch mask that includes the remaining mask portions 716A-D, for the top conductive layer 714, the dielectric layer 712, and the bottom conductive layer 710. FIG. 7B also depicts an etching process 720B. Etching process 720B may be a plasma etch process, or other suitable process for removing portions of bottom conductive layer 710.

Figure 7C:
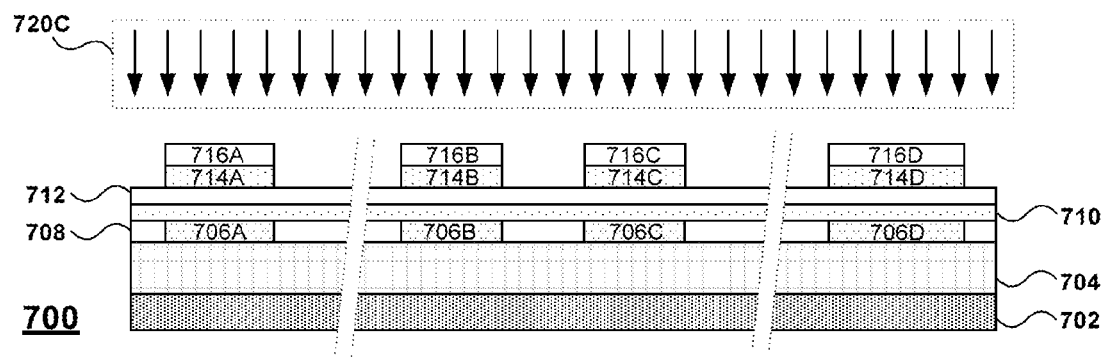

After etching process 720B, SOC 700 may appear as depicted in FIG. 7C, which portrays a plurality of top electrodes 714A-D. Top electrode 714A may function as the top electrode for a volatile memory element. Top electrodes 714B and 714C may function as top electrodes in two MIM structures in a non-volatile memory cell, and top electrode 714D may be the top electrode portion for a MIM decoupling capacitor. FIG. 7C also includes an etching process 720C.

Figure 7D:
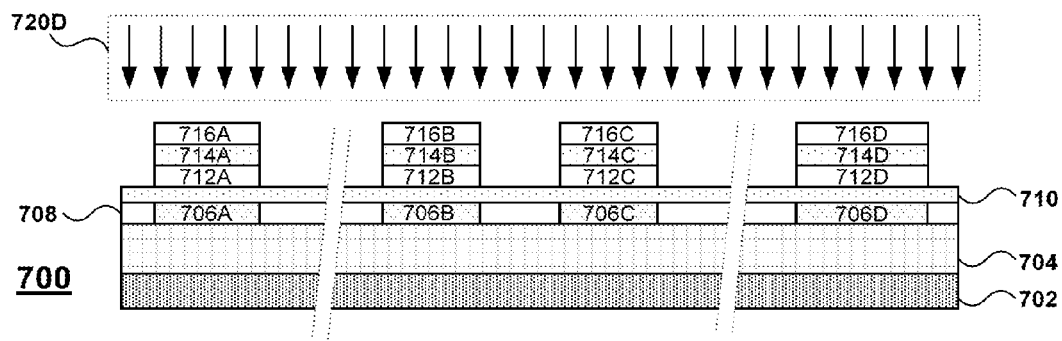
Figure 7E:
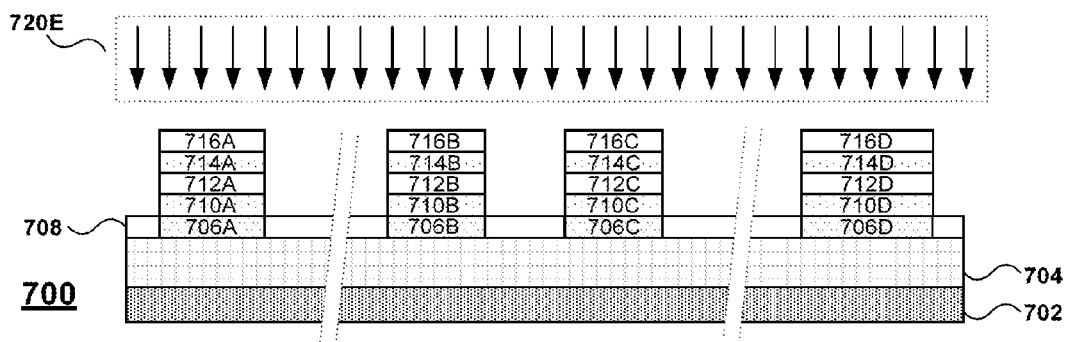

After etching process 720C, SOC 700 may include a plurality of dielectric layer portions 712A-D as shown in FIG. 7D. FIG. 7D includes an etching process 720D which may result in the removal of exposed portions of bottom conductive layer 710 to form a plurality of bottom electrodes 710A-D. Together, top electrode 714A, dielectric layer portion 712A, and bottom electrode 710A may form a volatile memory element, such as DRAM capacitor 452 of FIG. 4. Top electrodes 714B and 714C, dielectric layer portions 712B and 712C, and bottom electrodes 710B and 710C may form the MIM structures of a non volatile memory cell such as MIM structures 140 of the RRAM cell 130 of FIG. 4. Finally, top electrode 714D, dielectric layer portion 712D, and bottom electrode 710A may form a MIM decoupling capacitor 252 of FIG. 4.

Figure 7F:
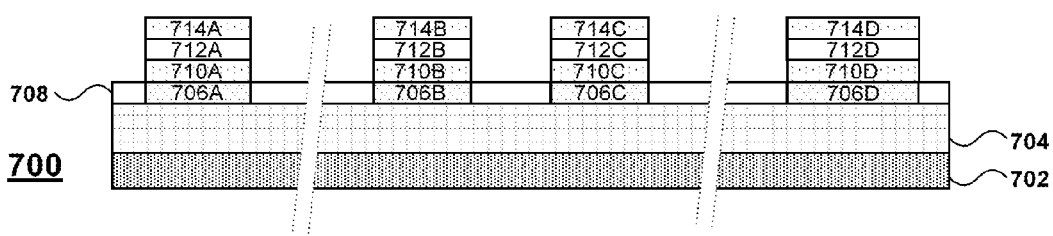

After layers 714, 712, and 710 have been patterned the remaining portions of masking layer 716 may be removed, IMD layers may be deposited as well as one or more vias and metallization layers. Thus, step 608 of method 600 may terminate with SOC 700 as depicted in FIG. 7F. In FIGS. 7A-7F, the top electrodes 714A-D, dielectric layer portions 712A-D, and bottom electrodes 710A-D are depicted as having the same horizontal dimension as the metallization layer contact areas 706A-D. This is for convenience is depictions, and in practice is generally not accurate. However, 714A-D, dielectric layer portions 712A-D, and bottom electrodes 710A-D share the same horizontal dimension within each vertical stack. In some embodiments, the dielectric layer portions 712A-D all have substantially the same thickness, and the thickness may be substantially constant, because the dielectric layer 712 has a substantially uniform thickness.

In some embodiments, a bottom conductive layer 710 is formed by a sputtering process used to deposit a Pt layer over IMD 708 and metallization contact areas 706A-B (step 602). A CMP process is performed to prepare the Pt layer for the deposition of a dielectric layer. A HfO layer is deposited by atomic layer deposition to serve as dielectric layer 712 (step 604), after which an additional Pt layer is sputtered to form a top conductive layer 714 (step 606). A silicon nitride masking layer 716 may be formed by a CVD process, and then patterned using a PR layer as a mask and buffered HF as an etchant. After the masking layer is prepared, the exposed portions of the Pt top conductive layer 714 patterned by a plasma etching process using $SF_6$, with the remaining Pt portions forming top electrodes 714A-D. The exposed portions of HfO dielectric layer 712 are removed using a plasma etch with a Cl-based gas, with the remaining portions forming dielectric layers 712A-D. Afterwards, the exposed portions of bottom conductive layer 710 are removed using the same process used for the top conductive layer 714 (step 608). The remaining portions of bottom conductive layer 710 form bottom electrodes 710A-D and complete the various MIM structures present in SOC 400, including the MIM structures 140 of an RRAM cell and a MIM decoupling capacitor 252. MIM structures 140 and MIM decoupling capacitor 252 are formed on the same layers and using a single mask.

Various embodiments may provide certain benefits. For instances, using the MIM decoupling capacitor may allow the capacitor to be better isolated from the substrate, decreasing some parasitic effects. This may also free up surface on the substrate for more logic components. Additionally, by using metal contacts, the performance of the decoupling capacitor may also increase, becoming more uniform. Also, the MIM decoupling capacitor can be fabricated without any more process steps or masks than required for the MIM structures use in the non-volatile memory cell, which may require only a single mask. Some embodiments include a decoupling capacitor device that has a bottom electrode, and a first dielectric layer portion located above, and in physical contact with, the bottom electrode. The first dielectric layer portion is deposited in a dielectric layer deposition process that also deposits a second dielectric layer portion in a resistive random-access memory (RRAM) cell. The first and second dielectric layer portions are patterned with a single mask. Finally, the decoupling capacitor device includes a top electrode located above, and in physical contact with, the first dielectric layer portion such that the top electrode, the first dielectric layer, and the bottom electrode form a capacitor.

Other embodiments include a system on a chip device. The system-on-chip (SOC) device includes a resistive random-access memory (RRAM) cell, which in turn includes a metal-insulator-metal (MIM) structure. The MIM structure has a bottom MIM electrode, a MIM insulating layer, and a top MIM electrode, and is situated in an inter-metal dielectric layer. The SOC device also includes a decoupling capacitor, which has a bottom capacitor electrode, a capacitor insulating layer, and a top capacitor electrode. The decoupling capacitor is also situated in the inter-metal dielectric layer. Additionally, the SOC device includes a logic area with a plurality of transistors on a substrate.

Yet other embodiments include a method for forming a process-compatible decoupling capacitor. The method includes steps of forming a bottom electrode layer above, and in electrical contact with, a metal layer; forming an insulating layer above the bottom electrode layer; and forming a top electrode layer above the insulating layer. The method also includes a step of patterning the top electrode layer, the insulating layer, and the bottom electrode layer to form a metal-insulator-metal (MIM) structure of a non-volatile memory element and also to form a decoupling capacitor.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a non-volatile memory (NVM) cell disposed within a first area, the NVM cell including a first dielectric layer; and
a decoupling capacitor disposed within a second area, wherein the decoupling capacitor comprises:
a bottom electrode;
a second dielectric layer located above, and in physical contact with, the bottom electrode, the second dielectric layer coplanar with the first dielectric layer; and
a top electrode located above, and in physical contact with, the second dielectric layer.

2. The device of claim 1, wherein the NVM cell further includes a metal-insulator-metal (MIM) structure, the MIM structure comprising a bottom MIM electrode-, the first dielectric layer disposed over the bottom MIM electrode, and a top MIM electrode disposed over the first dielectric layer, wherein the bottom MIM electrode includes a first metal layer, and wherein the top MIM electrode includes a second metal layer.

3. The device of claim 1, wherein each of the first and second dielectric layers include at least one of NiO, TiO, HfO, ZrO, ZnO, WO$_3$, Al$_2$O$_3$, TaO, MoO, and CuO.

4. The device of claim 2, wherein each of the first and second metal layers include at least one of Pt, AlCu, TiN, Au, Ti, Ta, TaN, W, WN, and Cu.

5. The device of claim 1, wherein the decoupling capacitor comprises a structure including one of a planar-type structure, a cylinder-type structure, a bar-type structure, and a dual-damascene structure.

6. A system-on-chip (SOC) device comprising:
a resistive random-access memory (RRAM) cell, the RRAM cell including a metal-insulator-metal (MIM) structure, the MIM structure comprising a bottom MIM electrode, a MIM insulating layer, and a top MIM electrode, the MIM structure being situated in an inter-metal dielectric layer;
a decoupling capacitor, the decoupling capacitor comprising a bottom capacitor electrode, a capacitor insulating layer, and a top capacitor electrode, the decoupling capacitor situated in the inter-metal dielectric layer;
a logic area comprising a plurality of transistors on a substrate; and
wherein the bottom MIM electrode is coplanar with the bottom capacitor electrode, the MIM insulating layer is coplanar with the capacitor insulating layer, and the top MIM electrode is coplanar with the top capacitor electrode.

7. The SOC device of claim 6, wherein the MIM structure and the decoupling capacitor are both disposed within a single inter-metal dielectric (IMD) layer.

8. The SOC device of claim 7, further comprising a plurality of inter-metal dielectric (IMD)_layers, the decoupling capacitor and the MIM structure disposed within one layer of the plurality of inter-metal dielectric layers.

9. The SOC device of claim 7, wherein at least one logic transistor is situated below the decoupling capacitor, but is not in electrically-conducting contact with the decoupling capacitor.

10. The SOC device of claim 7, further comprising a volatile memory cell, the volatile memory cell including a capacitive memory element disposed within the single inter-metal dielectric (IMD) layer, wherein the capacitive memory element includes a bottom capacitive element electrode that is coplanar with the bottom capacitor electrode, a capacitive insulating layer that is coplanar with the capacitor insulating layer, and a top capacitive electrode that is coplanar with the top capacitor electrode.

11. The SOC device of claim 10, wherein the volatile memory cell is a dynamic random-access memory (DRAM) cell.

12. A device comprising:
a resistive random-access memory (RRAM) cell, the RRAM cell including a metal-insulator-metal (MIM) structure, the MIM structure comprising a bottom MIM electrode, a MIM insulating layer, and a top MIM electrode, the MIM structure being situated in an inter-metal dielectric layer; and
a decoupling capacitor including a bottom capacitor electrode disposed in a layer coplanar with the bottom MIM electrode, a capacitor insulating layer, and a top capacitor electrode disposed in the same layer as the top MIM electrode;
wherein the bottom capacitor electrode and the bottom MIM electrode include coplanar surfaces, and wherein the top capacitor electrode and the top MIM electrode include coplanar surfaces.

13. The device of claim 12, wherein the bottom capacitor electrode and the bottom MIM electrode are coupled to each other by way of a metallization stack.

14. The device of claim 12, wherein the top capacitor electrode and the top MIM electrode are coupled to each other by way of a metallization stack.

15. The device of claim 12, wherein the RRAM cell is surrounded by an inter-level dielectric.

16. The device of claim 15, wherein the decoupling capacitor is surrounded by the inter-level dielectric.

17. The device of claim 12, wherein the top capacitor electrode and the top MIM electrode include one of Pt, AlCu, TiN, Au, Ti, Ta, TaN, W, WN, and Cu.

18. The device of claim 12, wherein the capacitor insulating layer and the MIM insulating layer include the same material.

* * * * *